United States Patent
Toshima et al.

(12)

(10) Patent No.: US 6,454,519 B1
(45) Date of Patent: *Sep. 24, 2002

(54) DUAL CASSETTE LOAD LOCK

(75) Inventors: Masato M. Toshima, Sunnyvale; Phil M. Salzman, San Jose; Steven C. Murdoch, Palo Alto; Cheng Wang, San Jose; Mark A. Stenholm, Fremont; James Howard, Santa Clara; Leonard Hall, San Jose; David Cheng, Sunnyvale, all of CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 08/813,480

(22) Filed: Mar. 7, 1997

Related U.S. Application Data

(60) Continuation of application No. 08/099,983, filed on Jul. 30, 1993, now abandoned, which is a continuation of application No. 07/849,115, filed on Mar. 10, 1992, now abandoned, which is a division of application No. 07/511,481, filed on Apr. 19, 1990, now Pat. No. 5,186,594.

(51) Int. Cl.$^7$ .............................................. B65G 49/05
(52) U.S. Cl. ..................... 414/805; 414/217; 414/217.1; 414/222.01; 414/939; 414/940; 118/719; 118/500
(58) Field of Search ........................... 414/222.01, 217, 414/800, 808, 805, 940, 939, 935, 680, 217.1, 416.01, 416.03, 416.08; 204/298.25; 118/719, 729, 730.5, 50.1, 500

(56) References Cited

U.S. PATENT DOCUMENTS

| | | | | |
|---|---|---|---|---|
| 2,224,479 A | * | 12/1940 | Jones | |
| 3,749,383 A | * | 7/1973 | Voight et al. | |
| 4,448,149 A | * | 5/1984 | Brown, Jr. et al. | |
| 4,592,306 A | * | 6/1986 | Gallego | 414/DIG. 5 X |
| 4,640,223 A | * | 2/1987 | Dozier | |
| 4,715,921 A | * | 12/1987 | Maher et al. | |
| 4,764,076 A | * | 8/1988 | Layman et al. | 414/939 X |
| 4,776,744 A | * | 10/1988 | Stonestreet et al. | 414/940 X |
| 4,851,018 A | * | 7/1989 | Lazzari et al. | 414/940 X |
| 4,851,101 A | * | 7/1989 | Hutchinson | |
| 4,891,488 A | * | 1/1990 | Davis et al. | |
| 4,951,601 A | * | 8/1990 | Maydan et al. | 414/217 X |
| 4,963,069 A | * | 10/1990 | Wurst et al. | 414/940 X |
| 4,966,519 A | * | 10/1990 | Daris et al. | 414/939 X |
| 4,969,790 A | * | 11/1990 | Petz et al. | |
| 4,990,047 A | * | 2/1991 | Wagner et al. | 414/939 X |
| 5,064,337 A | * | 11/1991 | Asakawa et al. | 414/940 X |

FOREIGN PATENT DOCUMENTS

| | | |
|---|---|---|
| EP | 0 343 530 | 5/1989 |
| JP | 60-109218 | 6/1985 |

(List continued on next page.)

*Primary Examiner*—Frank E. Werner
(74) *Attorney, Agent, or Firm*—Dugan & Dugan LLP

(57) ABSTRACT

A workpiece loading interface is included within a workpiece processing system which processes workpieces, typically wafers, in a vacuum. The workpiece loading interface includes two separate chambers. Each chamber may be separately pumped down. Thus, while a first cassette of wafers, from a first chamber is being accessed, a second cassette of wafers may be loaded in the second chamber and the second chamber pumped down. Each chamber is designed to minimize intrusion to a clean room. Thus a door to each chamber has a mechanism which, when opening the door, first moves the door slightly away from an opening in the chamber and then the door is moved down parallel to the chamber. After the door is opened, a cassette of wafers is lowered through the opening in a motion much like a drawbridge. The cassette may be pivoted within the chamber when the position from which wafers are accessed from the cassette differs from the position from which the cassette is lowered out of the chamber.

9 Claims, 3 Drawing Sheets

FOREIGN PATENT DOCUMENTS

| | | | | | | |
|---|---|---|---|---|---|---|
| JP | 61-129881 | | 1/1986 | JP | 1-166534 | 6/1989 |
| JP | 282224 | * | 12/1986 | JP | 1-251734 | 10/1989 |
| JP | 62-139340 | | 6/1987 | JP | 1-253237 | 10/1989 |
| JP | 62-154749 | | 7/1987 | WO | 8706561 | * 11/1987 |
| JP | 62-290616 | | 12/1987 | | | |

* cited by examiner

DUAL CASSETTE LOAD LOCK

This application is a continuation of U.S. patent application Ser. No. 08/099,983 filed Jul. 30, 1993, now abandoned, which is a continuation of U.S. patent application Ser. No. 07/849,115, filed Mar. 10, 1992, now abandoned which is a divisional of U.S. patent application Ser. No. 07/511,481, filed Apr. 19, 1990, now U.S. Pat. No. 5,186,594.

BACKGROUND

The present invention relates to a front end loading interface used in the loading of workpieces in semiconductor processing equipment.

Semiconductor processing equipment often has a plurality of chambers in which processing occurs. Arm assemblies or other robotic devices are generally used to move workpieces, generally wafers from a wafer queuing station to various chambers for processing. When the processing is finished the wafer is returned to the queuing station. For an example of prior art processing equipment, see U.S. Pat. No. 4,715,921 issued to Maher et al. for a Quad Processor.

Semiconductor processing is typically done in a vacuum. Therefore, a wafer queuing station into which is placed a cassette of wafers to be processed must be pumped down before the wafers may be accessed. This significantly increases the time the semiconductor processing equipment is idle while waiting for a cassette of processed wafers to be exchanged for a cassette of unprocessed wafers and subsequent pumping down of the wafer queuing station.

SUMMARY OF THE INVENTION

In accordance with the preferred embodiment of the present invention, a workpiece loading interface is presented for inclusion within a workpiece processing system. The workpiece loading interface includes two separate chambers. Each chamber may be separately pumped down. Thus, while a first cassette of workpieces, typically wafers, from a first chamber are being accessed, a second cassette of wafers may be loaded in the second chamber and the second chamber may then be pumped down. This can significantly increase throughput of wafers through the workpiece processing system.

In the preferred embodiment, each chamber is designed to minimize intrusion to a clean room. Thus a door to each chamber has a mechanism which, when opening the door, first moves the door slightly away from an opening in the chamber and then the door is moved down parallel to the chamber. After the door is opened, a cassette of wafers is lowered through the opening in a motion much like a drawbridge. The cassette of wafers is on a support with no side panels, facilitating the replacement of a cassette of processed wafers with a cassette of unprocessed wafers by an automated device. The cassette may be pivoted within the chamber when the position from which wafers are accessed from the cassette differs from the position from which the cassette is lowered out of the chamber.

DESCRIPTION OF THE PREFERRED EMBODIMENT

Figure 1:
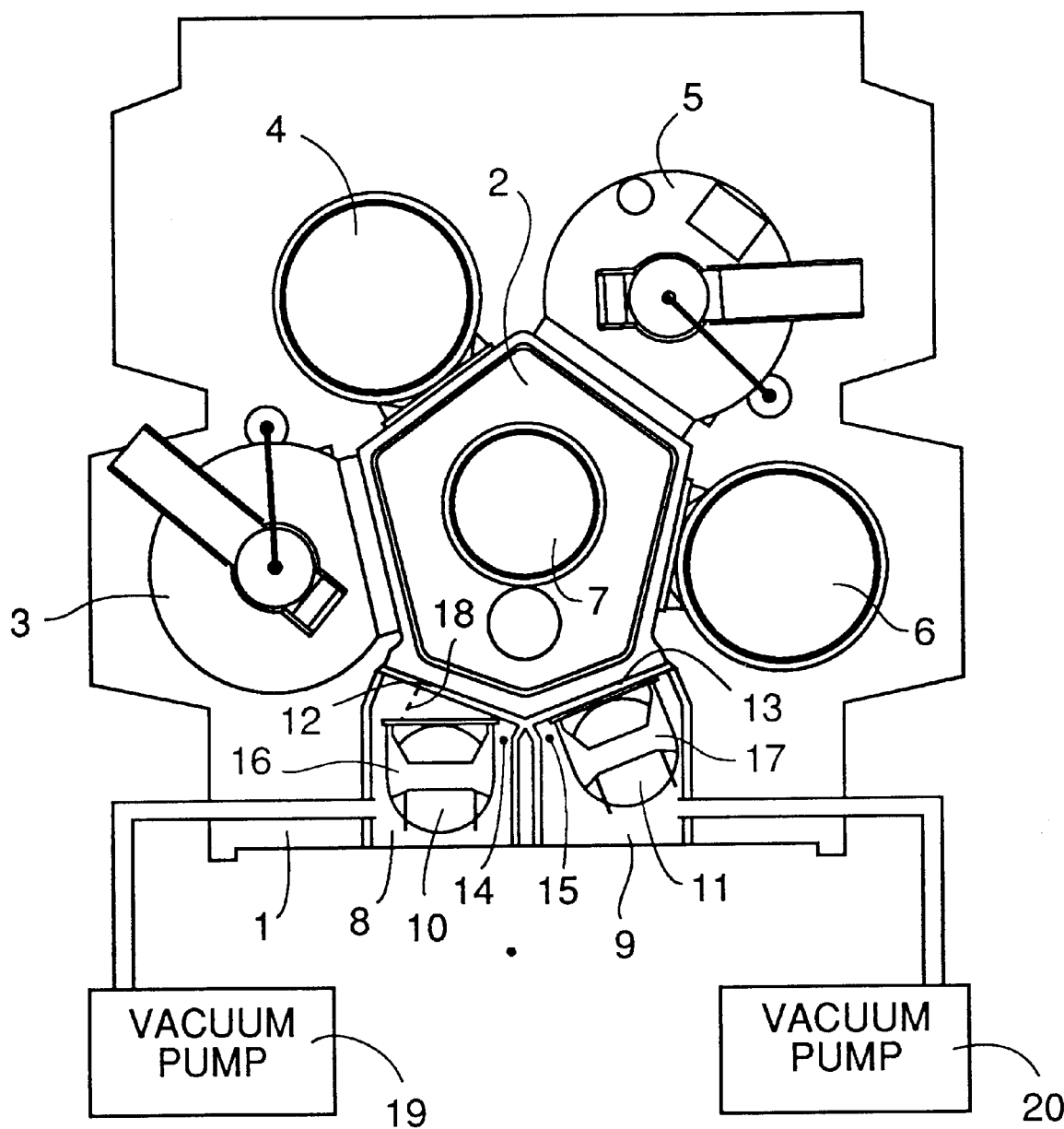
FIG. 1 shows a top view of a block diagram of semiconductor processing equipment which includes two cassette load locks in accordance with the preferred embodiment of the present invention.

In FIG. 1, a top view of semiconductor processing equipment 1 is shown. Semiconductor processing equipment 1 may be used, for example, for etching wafers.

Semiconductor processing equipment 1, includes, for example, a processing chamber 3, a processing chamber 4, a processing chamber 5 and a processing chamber 6. A central chamber 2 may be used to temporarily store wafers on robotic equipment 7 when wafers are being moved to or from various of the processing chambers.

Semiconductor processing equipment also includes dual cassette load locks. In chamber 8, a wafer cassette 16 holds wafers 10. In chamber 9, a wafer cassette 17 holds wafers 11. Wafer tray 17 pivots around a pivot point 15. When wafers 11 from tray 17 are accessed by semiconductor processing equipment 1 for processing, wafer tray 17 is flush against a gate 13, as shown, and easily accessed by robotic equipment 7 for transportation into central chamber 2. When wafer tray 17 is ready to be removed from chamber 9, wafer tray 17 is pivoted back from gate 13 in preparation for the opening of chamber 9 and removal of wafer tray 17.

Similarly, wafer tray 16 pivots around a pivot point 14. When wafers 10 from tray 16 are accessed by semiconductor processing equipment 1 for processing, wafer tray 16 is flush against a gate 12 and easily accessed by robotic equipment 7 for transportation into central chamber 2. When wafer tray 16 is ready to be removed from chamber 8, wafer tray 16 may be pivoted back an angle 18 from gate 12, as shown, in preparation for the opening of chamber 8 and removal of wafer tray 16. In the preferred embodiment, angle 18 is about twenty-one degrees.

Chamber 8 and chamber 9 may be separately and individually pumped down. A vacuum pump 19 is able to provide a vacuum in chamber 8. A vacuum pump 20 is able to provide a vacuum in chamber 9. In FIG. 1, vacuum pumps 19 and 20 are shown in schematic form. Typically pumps 19 and 20 would reside within semiconductor processing equipment 1. Further, while FIG. 1 shows two separate pumps, a single pump could be used to separately and individually pump down chamber 8 and chamber 9.

Figure 2:
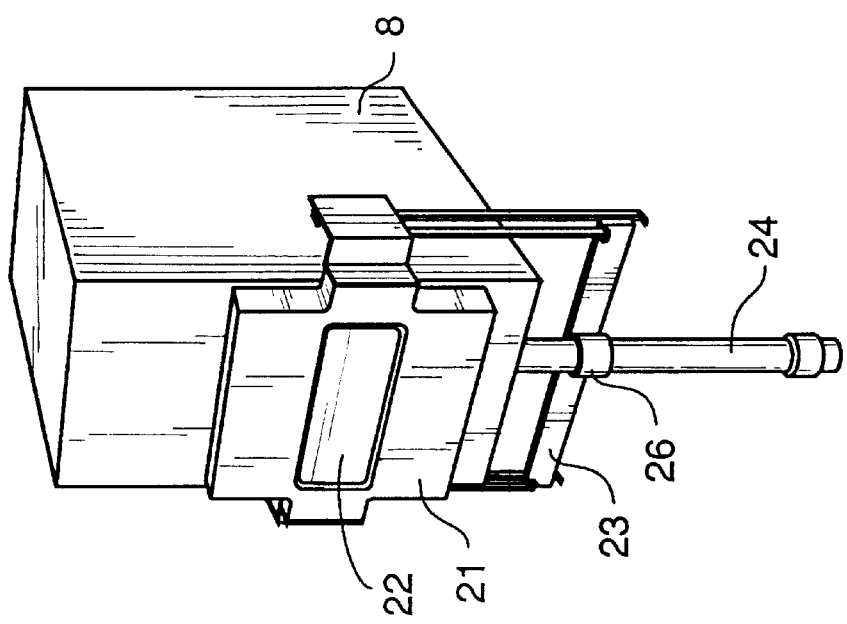
FIG. 2 shows a block diagram of a load lock which is part of the semiconductor processing equipment shown in FIG. 1 in accordance with the preferred embodiment of the present invention.

FIG. 2 shows a simplified block diagram front view of wafer chamber 8. In the preferred embodiment, the volume of chamber 8 is 46 liters. A door 21 is shown in a closed position. Door 21 includes an observation window 22. Door 21 is opened and closed using a pneumatic actuator within a rod 24. Magnets in the pneumatic actuator interface attract an outer ring 26. Outer ring 26 is connected to door 21 through an assembly 23.

Figure 3:
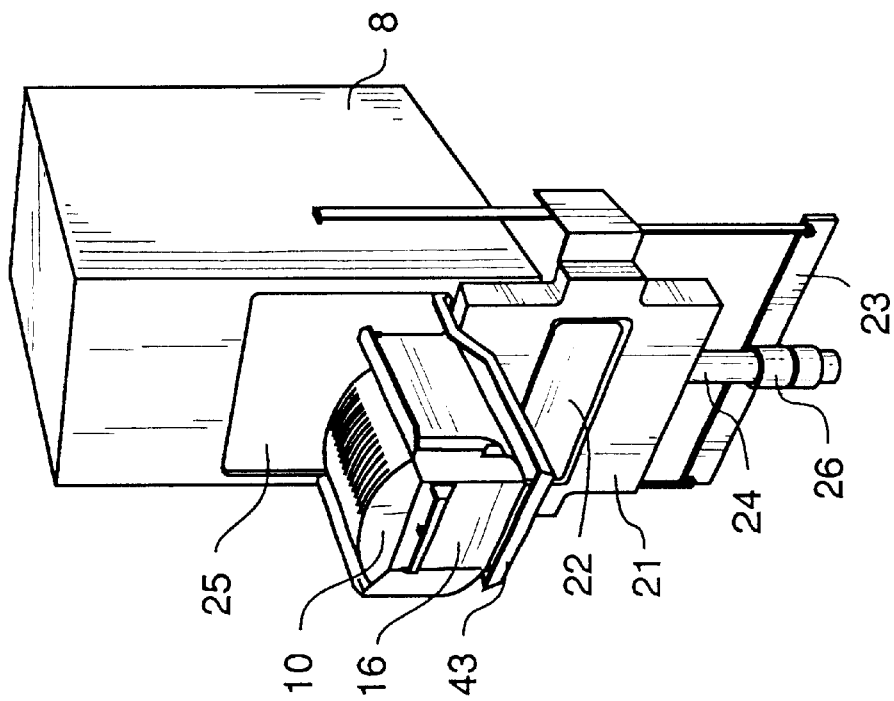
FIG. 3 shows a second block diagram of the load lock shown in FIG. 2 in accordance with the preferred embodiment of the present invention.

FIG. 3 shows door 21 lowered into an open position. An opening 25, for example may be fifteen inches high and ten and one half inches wide. By opening down, the intrusion of door 21 into a clean room may be minimized. In the preferred embodiment the total intrusion is about one inch.

Once door 21 is lowered, wafer tray 16, on a support structure 43, may then be lowered out of chamber 8, much like a draw bridge is lowered at a castle entrance. Wafer tray 16 may then be removed and a new wafer tray placed upon support structure 43. Support structure 43 is designed with a hollow bottom so that when door 21 is opened and wafer tray 16 is lowered, a laminar airflow may sweep downward through wafers 10.

Figure 4:
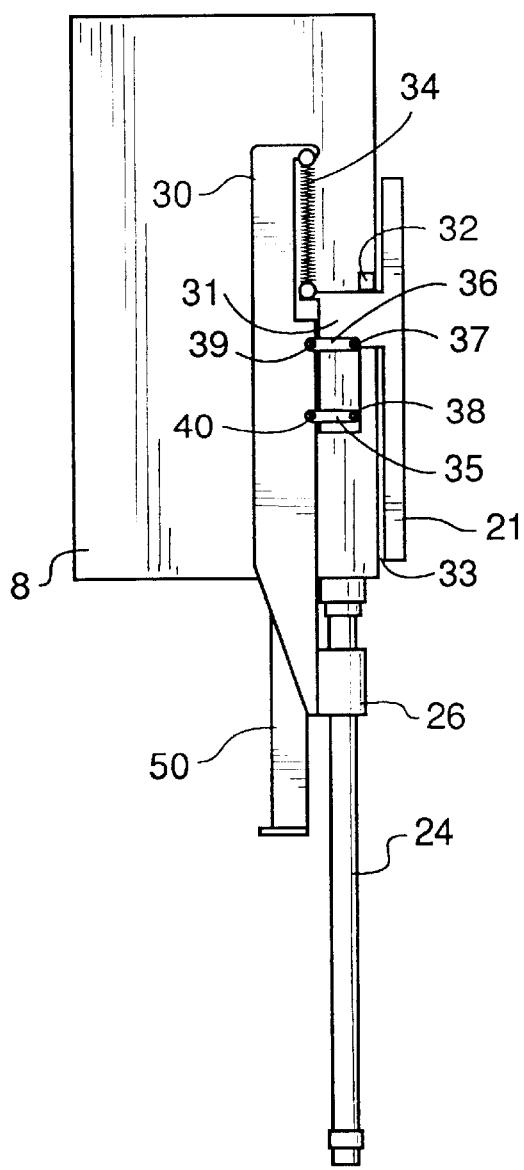
FIG. 4 shows another block diagram of the load lock shown in FIG. 2 in accordance with the preferred embodiment of the present invention.

In FIG. 4, additional detail of the mechanism which controls the opening and shutting door 21 is shown. A side panel 31 of door 21 is connected to a carriage 30 by a spring 34, a link 36 and a link 35. As controlled by the pneumatic actuator within rod 24, door 21 travels up and down parallel to a rail 50. When being closed, door 21 is stopped by an abutment 32; however, carriage 30 continues upward, expanding spring 34, until a gap 33 is completely closed. While carriage 30 continues moving upward, a pivot 39 connected to link 36, and a pivot 40 connected to link 35 continue moving upward. However a pivot 37 connected to link 36 and a pivot 38 connected to link 35 cause door 21 to move towards carriage 30. Therefore, as gap 33 is closed, links 35 and 36 translate the upward motion of carriage 30 into horizontal motion of door 21. Door 21 is thus brought snug against, and hence seals chamber 8.

When door 21 is opened, spring 34 compresses causing gap 33 to reappear and links 35 and 36 to straighten, thus moving door 21 horizontally away from chamber 8.

Figure 6:
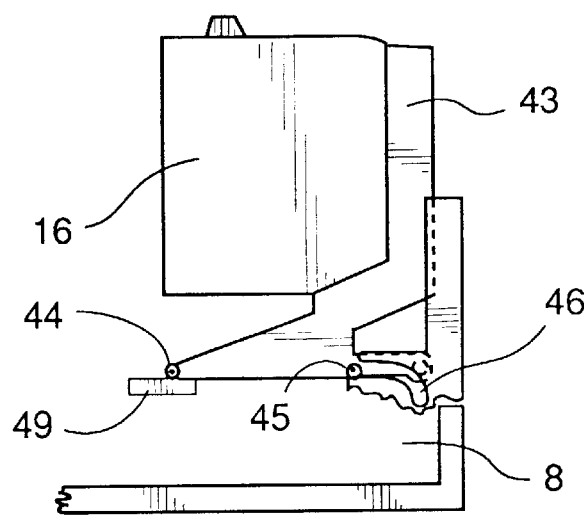
FIG. 6 is a block diagram of the cassette wafer shown in FIG. 5 in an upright position within the load lock shown in FIG. 2 in accordance with the preferred embodiment of the present invention.
Figure 5:
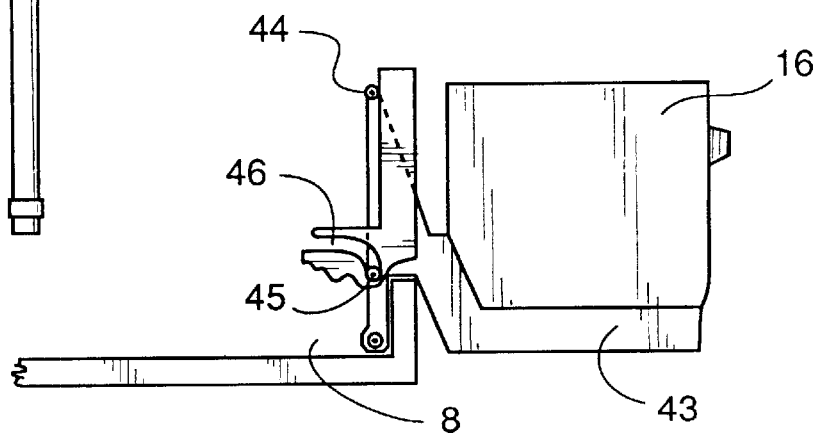
FIG. 5 is a block diagram of a cassette wafer holder in a position extended out of the load lock shown in FIG. 2 in accordance with the preferred embodiment of the present invention.

FIGS. 5 and 6 show a block diagram of one possible implementation of an assembly for guiding the lowering and raising of support structure 43. In FIG. 5, support structure 43 and cassette 16 are shown lowered out of chamber 8. A roller 44 connected to support structure 43 is shown resting on an extension of a cam containing slot 46 within chamber 8. A roller 45, also connected to support structure 43, is shown at a first end of a slot track 46.

In FIG. 6, support structure 43 and cassette 16 are shown in the upright position within chamber 8. In this position, wafers 10 are horizontal and are stacked so that they are ready to be accessed by semiconductor processing equipment 1. When support structure 43 and cassette 16 are in the upright position, roller 45 is rolled to a second end of slot track 46 and roller 44 rests against a stop 49. Stop 49 is an extension of the cam which contains slot 46.

We claim:

1. In a workpiece processing system comprising multiple vacuum processing chambers coupled to a central chamber, a method for loading workpieces into the central chamber, comprising the steps of:

providing dual workpiece load/unload chambers coupled to the central chamber, each having an opening for receiving workpieces held in a cassette and for forwarding the cassette of workpieces to the central chamber of the workpiece processing chamber for further transfer to one of the multiple vacuum chambers for processing;

providing a cassette support pivotally mounted within each of said load/unload chambers;

pivoting each cassette support to a first pivot position;

operating each cassette support to raise and lower a cassette of workpieces into and out of the opening of the respective load/unload chamber when in the first pivot position of the cassette support about a horizontal axis, and thereafter pivoting each cassette to a second pivot position to position the cassette for forwarding of the workpieces to the central chamber from the second pivot position of the cassette support wherein pivoting occurs about a substantially vertical axis.

2. The method of claim 1 wherein the cassette support is vertically oriented and adjacent the opening for receiving workpieces when in the first pivot position and is vertically oriented and adjacent the opening for forwarding workpieces when in the second pivot position.

3. The method of claim 2 wherein when operating each cassette support to raise and lower, the cassette support lowers to a horizontally oriented position and raises to the vertically oriented position about a horizontal axis.

4. The method of claim 1 wherein the angle of pivoting about the substantially vertical axis between the first and second pivot position is about 21 degrees.

5. In a workpiece processing system comprising a central chamber connected to at least one processing chamber, a method for loading a workpiece into the central chamber, comprising the steps of:

providing dual workpiece load/unload chambers each coupled to the central chamber, the dual workpiece load/unload chambers each having a first opening for receiving a workpiece carrier and a second opening for forwarding a workpiece to the central chamber;

providing a workpiece carrier support pivotally mounted about a horizontal axis within each dual workpiece load/unload chamber to receive a workpiece carrier through the first opening;

within a first of the dual workpiece load/unload chambers:

pivoting the workpiece carrier support into a first pivot position when a first workpiece carrier is to be received through the first opening, the pivoting occurring in a first direction; and pivoting the workpiece carrier support into a second pivot position when a workpiece is to be extracted from the first workpiece carrier and forwarded to the central chamber, the pivoting occurring in a second direction that is opposite the first direction; and within a second of the dual workpiece load/unload chambers:

pivoting the workpiece carrier support into a first pivot position when a second workpiece carrier is to be received through the first opening, the pivoting occurring in the second direction; and pivoting the workpiece carrier support into a second pivot position when a workpiece is to be extracted from the second workpiece carrier and forwarded to the central chamber, the pivoting occurring in the first direction;

wherein each pivoting step occurs about a substantially vertical axis.

6. The method of claim 5 wherein the workpiece carrier support is vertically oriented in both the first and second pivot positions.

7. The method of claim 5 wherein the angle of pivoting about the substantially vertical axis between the first and second pivot positions is about 21 degrees.

8. In a workpiece processing system comprising a central chamber connected to at least one processing chamber, a method for loading a workpiece into the central chamber, comprising the steps of:

providing a workpiece load chamber coupled to the central chamber and having an opening for receiving a workpiece carrier and for forwarding a workpiece from the workpiece carrier to the central chamber;

providing a single workpiece carrier support mounted for movement about a horizontal axis and a vertical axis within the workpiece load chamber for dual movement between lowered and raised positions and first and second pivot positions;

pivoting the workpiece carrier support to the first pivot position;

operating the workpiece carrier support to move between a first lower position to receive the workpiece carrier and a second raised position to move the received workpiece carrier through the opening and place the workpiece carrier within the load chamber when in the first pivot position; and thereafter pivoting the workpiece carrier support to a second pivot position to forward a workpiece from the workpiece carrier to the central chamber;

wherein pivoting occurs about a substantially vertical axis.

9. The method of claim 8 wherein the angle of pivoting about the substantially vertical axis between the first and second pivot positions is about 21 degrees.

* * * * *